United States Patent
Johnson (10) Patent No.: US 7,200,778 B2
(45) Date of Patent: Apr. 3, 2007

(54) SYSTEM AND METHOD FOR VERIFYING HDL EVENTS FOR OBSERVABILITY

(75) Inventor: Tyler James Johnson, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 507 days.

(21) Appl. No.: 10/402,122

(22) Filed: Mar. 28, 2003

(65) Prior Publication Data
US 2004/0194041 A1 Sep. 30, 2004

(51) Int. Cl.
G06F 11/00 (2006.01)
(52) U.S. Cl. .............................. 714/47; 702/58; 702/59
(58) Field of Classification Search ................. 714/45, 714/33; 702/58, 59
See application file for complete search history.

(56) References Cited

U.S. PATENT DOCUMENTS

| | | | | |
|---|---|---|---|---|
| 4,228,537 A * | 10/1980 | Henckels et al. | ............. | 714/33 |
| 5,404,360 A * | 4/1995 | Suzuki et al. | ................. | 714/27 |
| 5,515,384 A * | 5/1996 | Horton, III | ................. | 714/732 |
| 5,546,562 A * | 8/1996 | Patel | ............................ | 703/14 |
| 5,737,517 A * | 4/1998 | Kite et al. | ..................... | 714/38 |
| 6,298,286 B1 * | 10/2001 | Ying | ............................. | 701/4 |
| 6,539,341 B1 * | 3/2003 | Li et al. | ..................... | 702/187 |
| 6,629,297 B2 * | 9/2003 | Ganesan et al. | ................ | 716/5 |
| 6,865,692 B2 * | 3/2005 | Friedman et al. | ............. | 714/25 |
| 2004/0003327 A1* | 1/2004 | Joshi et al. | .................... | 714/47 |
| 2005/0007826 A1* | 1/2005 | Boggs et al. | .......... | 365/189.01 |

OTHER PUBLICATIONS

Bart Vermeulen and Sandeep Kumar Goel, "Design for Debug: Catching Design Errors in Digital Chips", IEEE Design & Test of Computers; May-Jun. 2002; pp. 37-45.

* cited by examiner

*Primary Examiner*—Scott Baderman
*Assistant Examiner*—Loan Truong (57) ABSTRACT

In one embodiment, the invention is directed to a method of verifying conditions occurring during a simulation of a hardware design. The method comprises logging each occurrence of at least one specified condition in a first log; logging signals observed at an observability port in a second log; and comparing the first and second logs to determine whether for each occurrence of the at least one specified condition logged in the first log, a corresponding entry identifying a signal expected to be observed responsive to occurrence of the at least one specified condition is logged in the second log.

21 Claims, 5 Drawing Sheets

SYSTEM AND METHOD FOR VERIFYING HDL EVENTS FOR OBSERVABILITY

CROSS-REFERENCE TO RELATED APPLICATIONS

This application is related to U.S. patent application Ser. No. 10/402,034, filed Mar. 28, 2003, entitled AN INTEGRATED CIRCUIT; U.S. patent application Ser. No. 10/402,628, filed Mar. 28, 2003, entitled SYSTEM AND METHOD FOR USING A DEBUG BUS AS A CAPTURE BUFFER; and U.S. patent application Ser. No. 10/402,092, filed Mar. 28, 2003, entitled A BUS INTERFACE MODULE, all of which are hereby incorporated by reference in their entirety.

BACKGROUND

The increasing complexity of system designs, increased investment required due to this complexity, and shortened product cycles have presented significant challenges to post-silicon design verification of chipsets. This is especially true with respect to high-end cache coherent non-uniform memory access ("ccNUMA") chipsets where systems can be extremely large and complex. Processor post-silicon verification is typically focused on electrical verification at least as much as functional verification due to the large amount of full custom design. Chipsets present a different challenge due to the large number of cells of which they are comprised. Additionally, due to the sheer number of buses, internal bus arbitration, cache coherency control, queue arbitration, etc., in a large ccNUMA server, post-silicon functional verification of such a chipset consumes a greater amount of resources with respect to electrical verification than processors typically consume. Internal observability, while relatively simple in pre-silicon verification, poses a major obstacle to debug and functional test coverage.

Determining when system verification is complete is a second major obstacle to completing post-silicon verification in a time-effective manner. While pre-silicon simulation-based testing depends significantly on labor intensive directed and pseudo-random testing, post-silicon testing has historically depended on observing system operations that imply correct behavior.

Performing post-silicon design verification is an industry standard practice that facilitates exposure of bugs not typically uncovered in pre-silicon verification. Typical post-silicon bugs discovered include those that are manifested after long or at-speed operation of the system, those resulting due to incorrect modeling of hardware and firmware interfaces, those resulting from Register Transfer Language ("RTL") errors that escaped pre-silicon detection, and those resulting from incorrect mapping of RTL-to-silicon (synthesis/physical bugs). Accepted methods of exercising systems to expose post-silicon bugs include running operating systems and software applications targeted for the final system, creating specific directed software tests that stress different portions of the system, and running software tests that create random system operations.

Real-time observability ("RTO") refers to the ability to monitor and capture internal signals in real time either on- or off-chip. While internal signal observability features have been available in some field programmable gate array ("FPGA") architectures and application specific integrated circuits ("ASICs"), they have typically been of limited scope. Limiting factors have been silicon area, wiring constraints, and I/O limitations. In addition, observability features have traditionally been used for debug and not functional test coverage.

Once an IC is designed, with or without any internal signal observability capabilities, there remains a need for the design to be tested. Verilog HDL is a Hardware Description Language ("HDL"). An HDL is a language used to describe a digital system, for example, a computer or a component of a computer. One might describe a digital system at several levels. For example, an HDL might describe the layout of wires, resistors, and transistors on an IC chip; i.e., at the switch level. In contrast, one might describe the logic gates and flip-flops in a digital system, i.e., the gate level. An even higher level describes the registers and transfers of vectors of information between registers. This is called the Register Transfer Level ("RTL"). Verilog HDL supports all of these levels.

Verilog is a discrete event time simulator. As will be recognized by those of ordinary skill in the art, in Verilog HDL, the execution of a procedural statement can be triggered on the occurrence of a named event. A record of the occurrence of events during a simulation is maintained as an "event log" in an "event log file". A primary use of HDLs is the simulation of a design before the design is committed to fabrication. While several HDLs exist, none is known to support HDL events in the context of real-time observability of a digital system.

SUMMARY

In one embodiment, the invention is directed to a method of verifying conditions occurring during a simulation of a hardware design. The method comprises logging each occurrence of at least one specified condition in a first log; logging signals observed at an observability port in a second log; and comparing the first and second logs to determine whether for each occurrence of the at least one specified condition logged in the first log, a corresponding entry identifying a signal expected to be observed responsive to occurrence of the at least one specified condition is logged in the second log.

DETAILED DESCRIPTION OF THE DRAWINGS

In the drawings, like or similar elements are designated with identical reference numerals throughout the several views thereof, and the various elements depicted are not necessarily drawn to scale.

Figure 1:
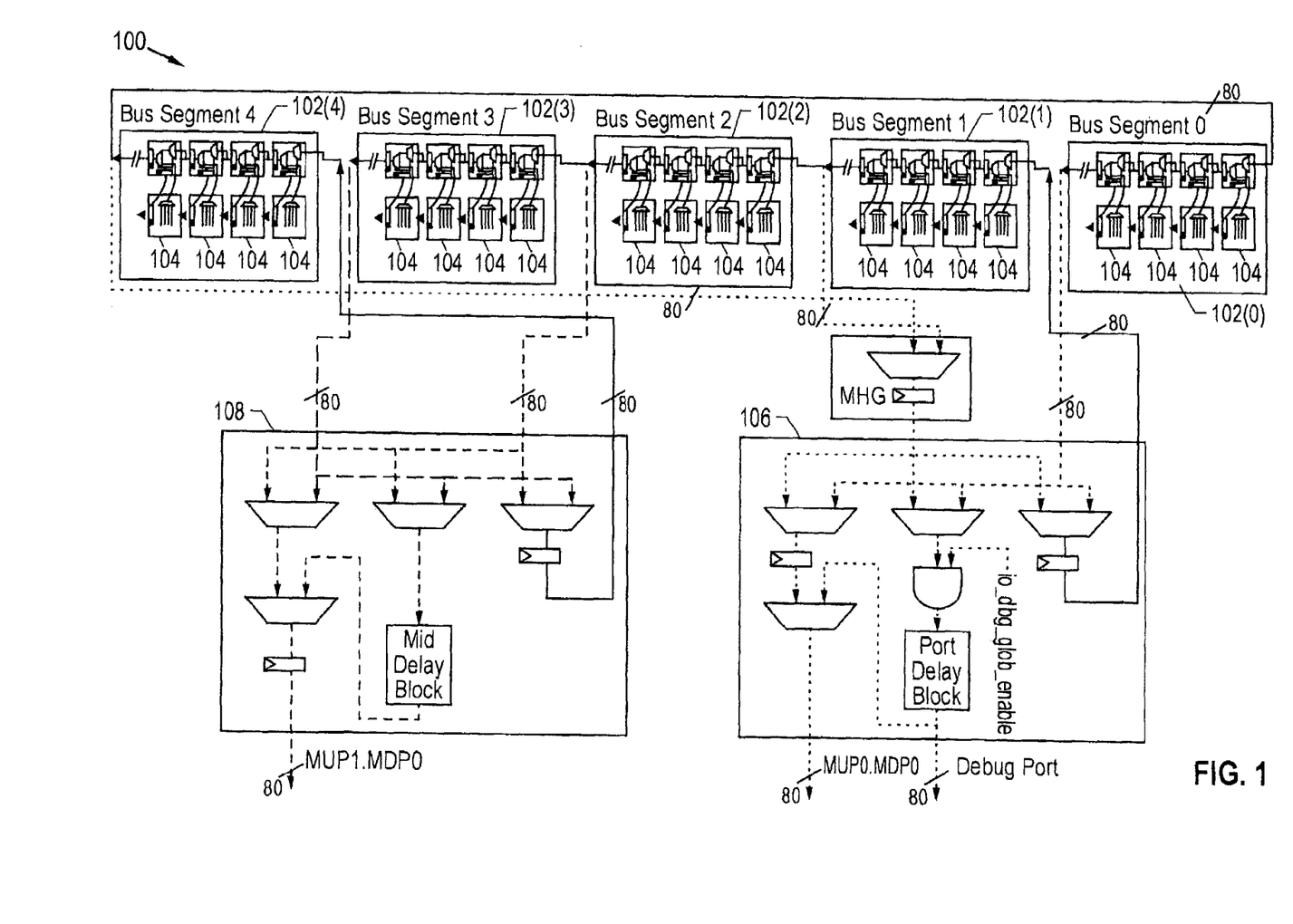
FIG. 1 is a block diagram of a debug bus of one embodiment.

As illustrated in FIG. 1, in accordance with one embodiment, a debug bus 100 comprises a plurality of bus segments 102(0)–102(4) interconnected in a serial ring and runs at the core clock speed of an IC, e.g., an ASIC, in which the bus is implemented. In one implementation, the debug bus 100 is 80-bits wide; however, in general, the width of the debug bus is consistent with device pin constraints. Moreover, although the illustrated embodiment employs only five bus segments 102(0)–102(4), it will be appreciated that greater or fewer than five bus segments may be implemented as necessary for providing appropriate logical and physical partitioning.

Each bus segment 102(0)–102(4) comprises several access points 104 at which data from surrounding logic is MUXed onto the debug bus 100. As will be described in greater detail below with reference to FIGS. 3 and 4, each access point 104 comprises a standard logic block with a proprietary MUX structure that drives debug data into the access point, which subsequently drives the data onto the debug bus 100.

As illustrated in FIG. 1, two observability ports 106, 108 are defined. In one embodiment, one of the ports, i.e., port 106, is a dedicated debug port. The other port, i.e., port 108, is loaded with functional signals. The debug bus 100 contains debug data that drives both of these ports 106, 108. In one embodiment, the debug port 106 has 80 data pins, plus four strobe pins that are single pumped, with the intention that the port 106 be connected directly to a logic analyzer (not shown).

As previously indicated, the debug port 106 is fed directly from the debug bus 100, which runs at core clock speed and connects the bus segments 106 in a serial ring. The debug bus 100 is segmented so that for any of a plurality of functional areas of an IC in which the bus is implemented, packets to and from the area can be observed in addition to 80 bits of internal state data. Additional details regarding implementation and operation of the debug bus 100 and ports 102, 104 are provided in commonly-assigned, co-pending U.S. patent application Ser. No. 10/402,034, filed Mar. 28, 2003, entitled AN INTEGRATED CIRCUIT, which has been incorporated by reference in its entirety hereinabove.

Figure 2:
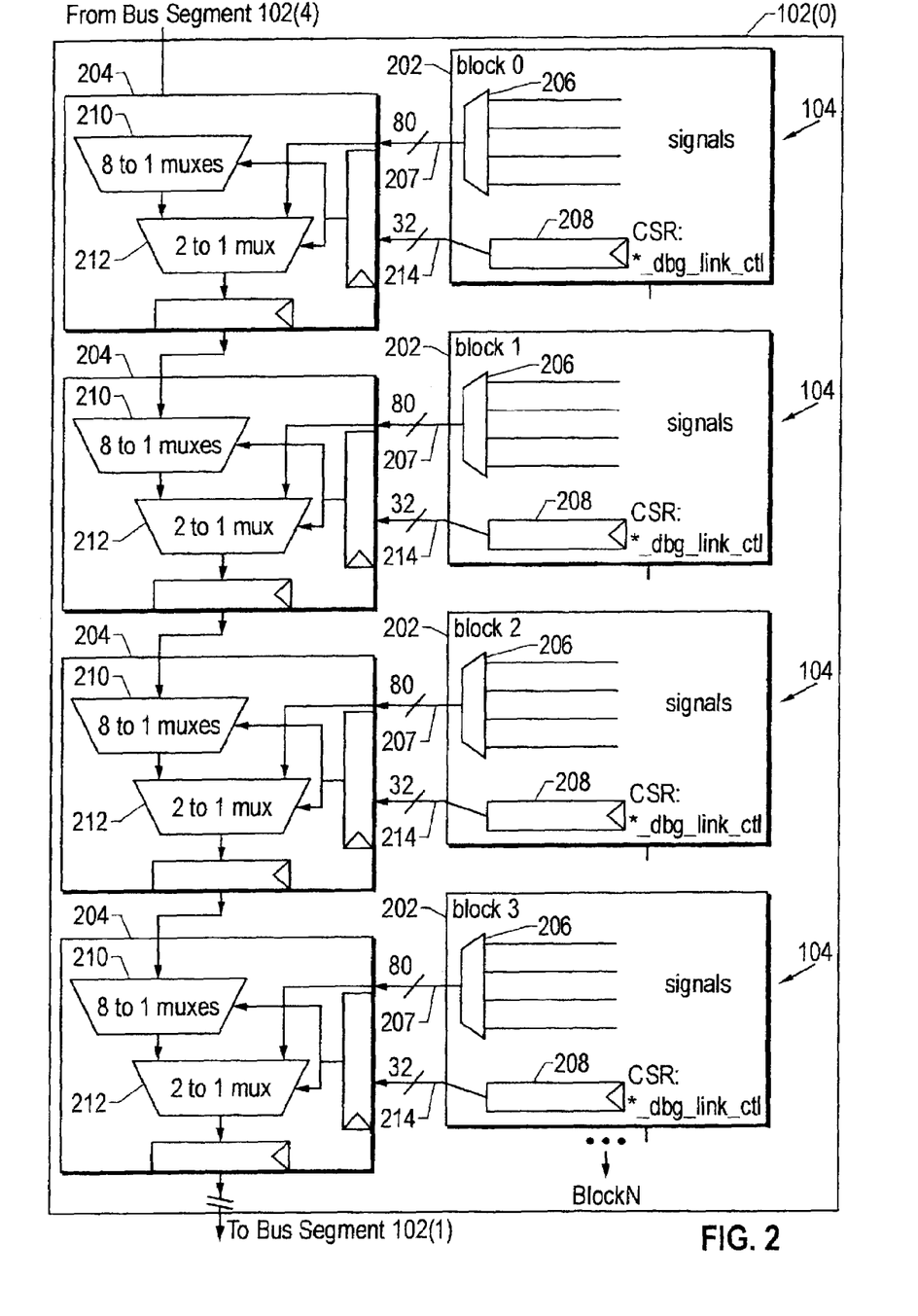
FIG. 2 is a block diagram of a bus segment of the debug bus of FIG. 1.

FIG. 2 is a more detailed block diagram of the bus segment 102(0) of the debug bus 100 illustrated in FIG. 1. As illustrated in FIG. 2, the bus segment 102(0) includes a plurality of access points 104. It should be noted that although only four access points 104 are shown, each bus segment 102(0)–102(4) may comprise greater or fewer access points as necessitated by the number of signals that must be handled by the bus segment.

As shown in FIG. 2, each access point 104 includes a local data intake section 202 and a corresponding debug bus interface block ("DBIB"), or Bus Interface Module, 204 connected thereto. At each access point 104, up to 80 bits of data from surrounding logic ("dbug_read_bus") is provided to the DBIB 204 thereof via a MUX 206 along a bus 207. A control and status register ("CSR") 208 provides a 32-bit MUX select signal ("*_dbg_link_ctl") to MUXes 210, 212, of the corresponding DBIB 204 for purposes that will be described in greater detail below via a bus 214.

Figure 3:
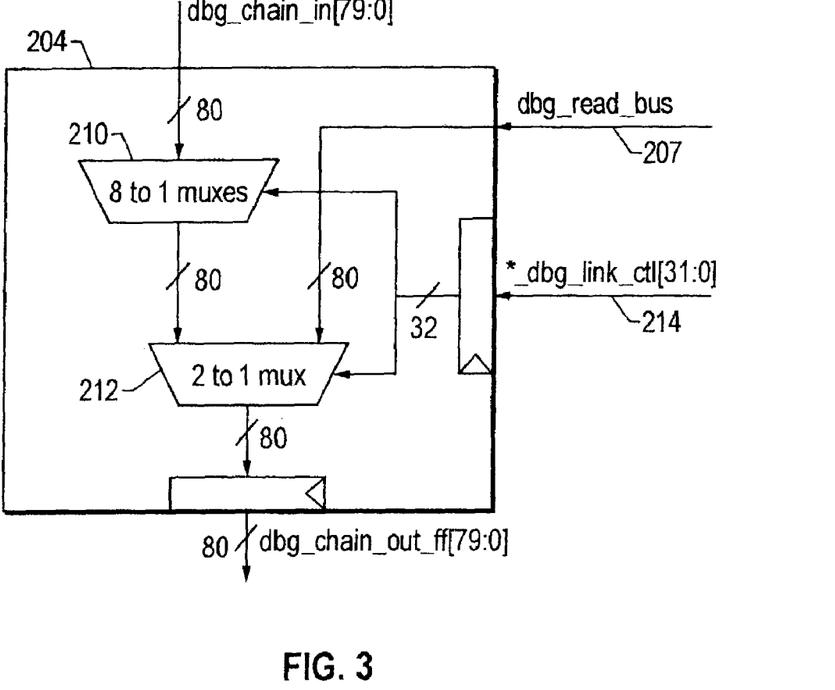
FIG. 3 is a block diagram of a standard logic block used to implement the bus segment of FIG. 2.

FIG. 3 is a more detailed block diagram of one of the DBIBs 204 of FIG. 2. In one embodiment, the debug bus 100 is logically divided into eight 10-bit blocks. Each DBIB 204 can move and/or replicate incoming debug bus data ("dbg_chain_in") from the previous DBIB in the chain in these 10-bit blocks to make room for incoming data ("dbg_read_bus") from the corresponding local data intake section 202, if necessary, and pass the newly configured data ("dbg_chain_out") to the next DBIB 204 in the chain. Generally, each DBIB 204 performs the following three functions: (1) it passes data on from the previous access point, (2) it moves 10-bit blocks of data from the previous access point to other ranges of the debug bus, allowing for more efficient bandwidth utilization; and (3) it MUXes in data from surrounding logic in 10-bit chunks.

As previously indicated, to make MUXing of data manageable, the debug bus 100 is logically divided into eight 10-bit blocks, each of which can be individually manipulated. Further, each access point 104 registers data from the previous access point, rearranges the data from previous access point in 10-bit blocks as specified by the corresponding CSR control signal ("*_dbg_link_ctl"), and MUXes in local data to be passed on to the next access point. Accordingly, the *_dbg_link_control signal functions as a MUX select signal.

In accordance with features of one embodiment, an HDL event is defined that contains a functional signal name, a MUX select configuration required to see the functional signal at the observability port 106 (FIG. 1), and the bit position of the functional signal on the observability port. An exemplary event macro for defining such an event, designated "EVENT_DBG_C", is set forth below:

EVENT_DBG_C(<ck>,<mux_sel>,<constant>,<signal_name>, <offset>,<slot>,<event_ID>);

| | |
|---|---|
| <ck> | The core clock. |
| <mux_sel> | The bits in *_dbg_link_ctl required to enable the signal identified by <signal_name>. This field can be 1 to 64 bits. This will be a variable. |
| <constant> | When <mux_sel>=<constant>, the event triggers. This field is also 1 to 64 bits. This will be a constant. Include everything that is not a "don't care", including zeros. |
| <signal_name> | The signal (variable) going to the debug bus. Do not zero fill. The field of the signal identified by <signal_name> must be aligned to a block boundary (unless a non-zero <offset> is specified) Signals that span multiple blocks are OK, but the blocks must be contiguous and enabled by the same MUX select bits. |
| <offset> | The offset from a 10-bit block boundary (hex value 0 to 9) of the signal identified by <signal_name>. Most signals should be aligned on a 10-bit block boundary and therefore have a 0 in this field. |

| | -continued |
|---|---|
| <slot> | An 8-bit mask that indicates what block or blocks are written to for the signal identified by <signal_name> (constant). Blocks must be contiguous. |
| <event_ID> | The event ID. This MUST BE absolutely unique. Use of block as a prefix (e.g., pin_dbg_block0) is suggested. |

Event Macro

Figure 4:
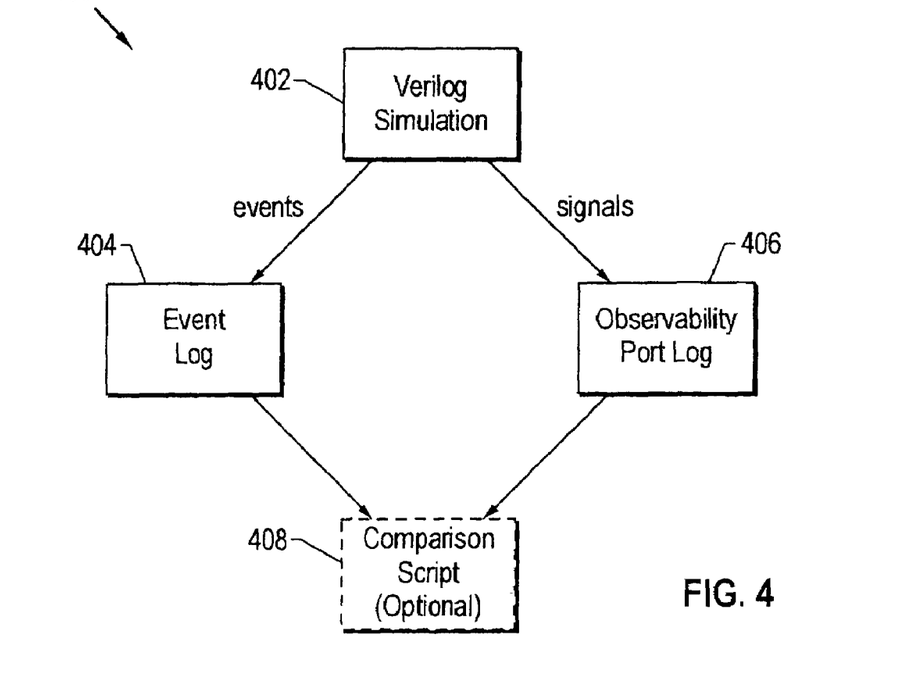
FIG. 4 represents a simulation run performed in accordance with one embodiment.

FIG. 4 represents a simulation run 400 performed in accordance with one embodiment. As shown in FIG. 4, during the simulation run 400, a Verilog HDL simulation 402 of the debug bus 100 (FIG. 1) is performed. During the simulation 402, each time the conditions are such that a signal should be active on the debug bus (i.e., when <mux_sel>=<constant>), the EVENT_DBUG_C fires and the occurrence of the event, including the signal name, placement (i.e., offset and slot), and the value of the MUX select signal, are noted in an event log 404. Simultaneously, the value of the signal is noted in an observability port log 406.

Once the simulation is complete, the two logs 404, 406 are compared, either manually or using a computer program or script 408 designed for that purpose, to determine whether the data from the functional signals appears on the observability port in the right location with all of the right values as indicated by the event log 404. In other words, the entries in the event log 404 indicate that conditions were proper for the named signal to have appeared at the observability port at the specified location; therefore, the signal should show up at the corresponding location in the observability port log 406. If this is not the case, that is, if the expected signal does not appear at the observability port, as indicated in the observability port log 406, a connectivity problem may be indicated.

Figure 5:
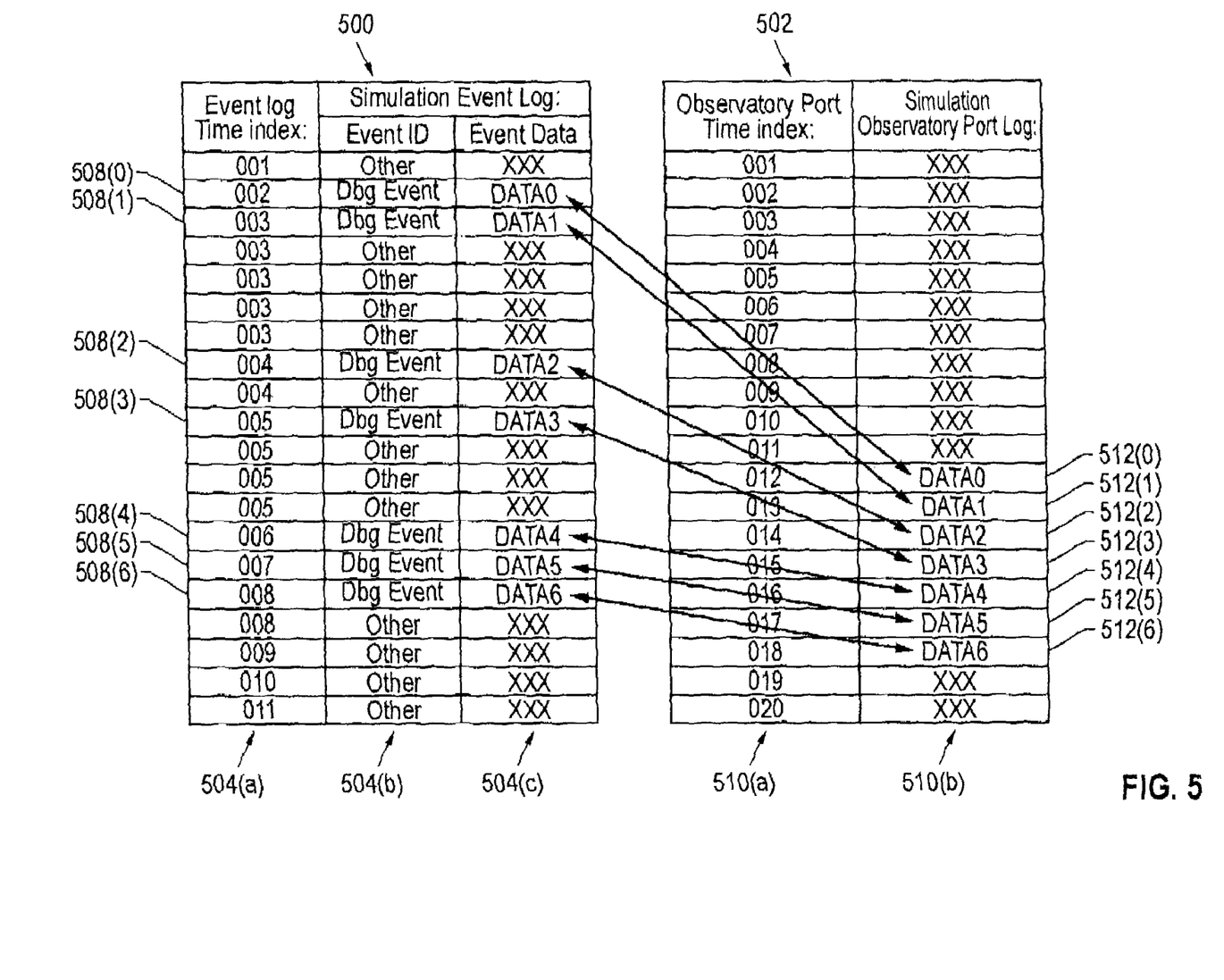
FIG. 5 illustrates the relationship between an exemplary event log and an exemplary observability port log generated in accordance with one embodiment.

FIG. 5 illustrates the relationship between an exemplary event log 500 and an exemplary observability port log 502 generated using the embodiments described herein. The event log 500 comprises three columns of information, including a column 504(a) containing time indices, a column 504(b) containing event IDs, and a column 504(c) containing event data. Each row of the event log 500 represents an entry; each entry is designated by a time index in the column 504(a). Several entries, for example, those entries designated by reference numeral 506, are events other than debug events and are therefore not relevant to the embodiments described herein. Remaining entries, i.e., those entries designated by reference numerals 508(0)–508(6), are debug events, as indicated by the notations made in the event ID column 504(b) thereof, and are therefore of interest.

Similarly, the observability port log 502 comprises two columns of information, including a column 510(a) comprising time index information, and a column 510(b) comprising the actual data logged as being observed at the observability port during simulation.

As previously noted, verification of HDL events will occur if, for each debug event noted in the event log 500 (entries 508(0)–508(6)), corresponding data is noted on the observability port, as indicated by the observability port log 502. This is the case in the example illustrated in FIG. 5. For example, with respect to the entry 508(1), corresponding data ("DATA0") is output at the observability port as indicated by an entry 512(0) in the observability port log 502. Similarly, data corresponding to entries 508(2)–508(6) (i.e., "DATA1", "DATA2", "DATA3", "DATA4", "DATA5", and "DATA6", respectively) is output at the observability port as indicated by entries 512(1)–512(6) in the observabilty port log 502. Accordingly, by comparing the two logs 500, 502, it is possible to determine not only that an event occurred, but that the expected signal was observed at the expected location (in this case, the observabilty port).

Figure 6:
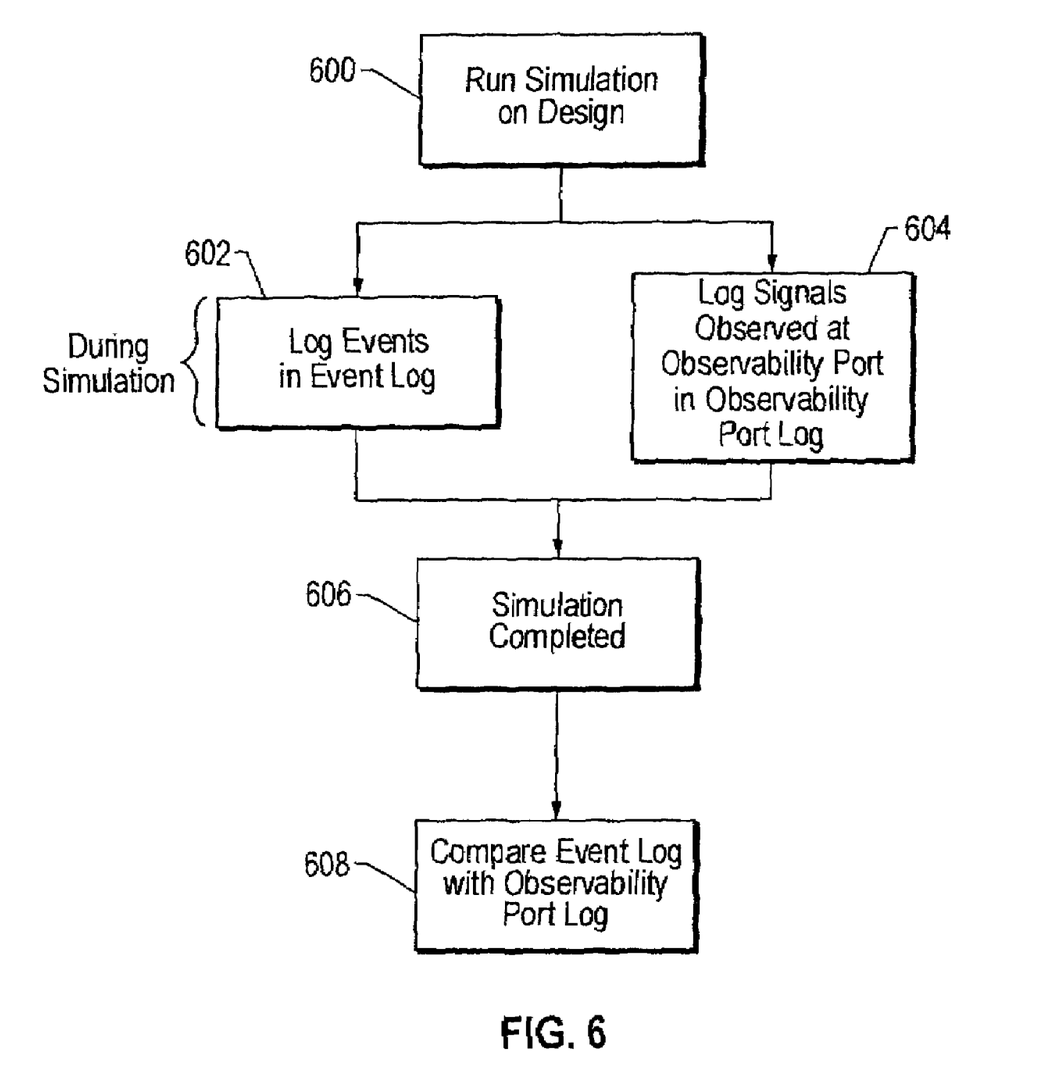
FIG. 6 illustrates a flowchart of the operation of one embodiment.

FIG. 6 is a flowchart of the operation of one embodiment. In block 600, an HDL simulation (e.g., a Verilog simulation) is run on the design, for example, the design for the debug bus of FIG. 1. In block 602, during the simulation, events are logged to an event log, such as the event log 500. As previously illustrated with reference to FIG. 5, each event log entry includes an event ID that identifies the type of the event (e.g., debug event) and event data, such as the name of the signal, MUX select signals, location of the signal, and so on. In block 604, which operates substantially simultaneously with block 602, signals observed at the observability port are logged in an observability port log, such as the log 502 (FIG. 5). Subsequent to completion of the simulation in block 606, in block 608, the entries in the event log and the observabilty port log are compared to verify the HDL events logged in the event log. As previously noted, this process can be performed manually or by a specially-written computer program or script designed for this purpose that is executed on a computer.

An implementation of the invention described herein thus provides system and method for verifying HDL events for enabling real-time observability in an IC. The embodiments shown and described have been characterized as being illustrative only; it should therefore be readily understood that various changes and modifications could be made therein without departing from the scope of the present invention as set forth in the following claims. For example, while the embodiments are described with reference to an ASIC, it will be appreciated that the embodiments may be implemented in other types of ICs, such as custom chipsets, Field Programmable Gate Arrays ("FPGAs"), programmable logic devices ("PLDs"), generic array logic ("GAL") modules, and the like. Additionally, the embodiments described herein may be implemented with HDLs other than Verilog HDL. Moreover, although the embodiments are described with reference to debug data, it will be recognized that they are applicable to verifying other types of HDL events and corresponding data as well.

Accordingly, all such modifications, extensions, variations, amendments, additions, deletions, combinations, and the like are deemed to be within the ambit of the present invention whose scope is defined solely by the claims set forth hereinbelow.

What is claimed is:

1. A method of verifying conditions occurring during a simulation of a hardware design, the method comprising:

logging each occurrence of at least one specified condition in a first log;

logging signals observed at an observability port in a second log; and comparing the first and second logs to determine whether for each occurrence of the at least one specified condition logged in the first log, a corresponding entry identifying a signal expected to be observed responsive to occurrence of the at least one specified condition is logged in the second log, wherein an entry in the first log identifies the signal expected to be observed at the observability port as well as location of a particular block and an indication of an offset from a boundary of the particular block of a multi-block debug bus to which the identified signal is written.

2. The method of claim 1 wherein the comparing occurs after the simulation is completed.

3. The method of claim 1 wherein the logging occurs during the simulation.

4. The method of claim 1 wherein the at least one specified condition is a Hardware Definition Language ("HDL") event.

5. The method of claim 1 wherein the at least one specified condition comprises multiplexer select bits being equal to a predetermined value.

6. The method of claim 1 wherein the observability port is connected to and receives signals from the multi-block debug bus.

7. The method of claim 1 wherein the multi-block debug bus is logically partitioned into a plurality of blocks.

8. The method of claim 1 wherein the multi-block debug bus comprises 80 bits, each block including 10 bits.

9. The method of claim 1 wherein the comparing is performed manually.

10. The method of claim 1 wherein the comparing is performed using a computer executing a specialized set of instructions.

11. A system for verifying conditions occurring during a simulation of a hardware design, the system comprising:

first log means comprising a plurality of entries for logging each occurrence during the simulation of at least one specified condition;

second log means comprising a plurality of entries for logging signals observed at an observability port during the simulation; and means for comparing entries of the first and second log means to determine whether for each entry denoting an occurrence of the at least one specified condition logged in the first log means, a corresponding entry identifying a signal expected to be observed responsive to occurrence of the at least one specified condition is included in the second log means, wherein an entry in the first log means identifies the signal expected to be observed at the observability port as well as location of a particular block and an indication of an offset from a boundary of the particular block of a multi-block debug bus to which the identified signal is written.

12. The system of claim 11 wherein the at least one specified condition is a Hardware Definition Language ("HDL") event.

13. The system of claim 11 wherein the at least one specified condition comprises multiplexer select bits being equal to a predetermined value.

14. The system of claim 11 wherein the observability port is associated with and receives signals from the multi-block debug bus.

15. The system of claim 11 wherein the multi-block debug bus is logically partitioned into a plurality of blocks.

16. The system of claim 11 wherein the multi-block debug bus comprises 80 bits, each block including 10 bits.

17. The system of claim 11 wherein the means for comparing comprises a computer executing a specialized set of instructions.

18. An apparatus for verifying the occurrence of conditions during a simulation of a hardware design, the apparatus comprising;

an event log stored on a computer readable medium for logging each occurrence of at least one specified condition;

a port log stored on a computer readable medium for logging signals observed at an observability port; and a computer-executable computer program stored on a computer readable medium for comparing the event log with the port log to determine whether for each occurrence of the at least one specified condition logged in the event log, a corresponding entry identifying a signal expected to be observed responsive to occurrence of the at least one specified condition is logged in the port log, wherein an entry in the event log identifies the signal expected to be observed at the observability port as well as location of a particular block and an indication of an offset from a boundary of the particular block of a multi-block debug bus to which the identified signal is written.

19. The apparatus of claim 18 wherein the at least one specified condition is a Hardware Definition Language ("HDL") event.

20. The apparatus of claim 18 wherein the at least one specified condition comprises multiplexer select bits being equal to a predetermined value.

21. The apparatus of claim 18 wherein the multi-block debug bus is logically partitioned into a plurality of blocks.

* * * * *

UNITED STATES PATENT AND TRADEMARK OFFICE
CERTIFICATE OF CORRECTION

PATENT NO.       : 7,200,778 B2                                              Page 1 of 1
APPLICATION NO.  : 10/402122
DATED            : April 3, 2007
INVENTOR(S)      : Tyler James Johnson It is certified that error appears in the above-identified patent and that said Letters Patent is hereby corrected as shown below:

In column 8, line 23, in Claim 18, after "comprising" delete ";" and insert -- : --, therefor.

Signed and Sealed this

Twenty-sixth Day of August, 2008

JON W. DUDAS
*Director of the United States Patent and Trademark Office*